US008500296B2

(12) United States Patent
Gates

(10) Patent No.: US 8,500,296 B2
(45) Date of Patent: Aug. 6, 2013

(54) METAL LIVING HINGE

(75) Inventor: Ryan Gates, Surrey (CA)

(73) Assignee: Philips Electronics Ltd., Vancouver (CA)

( * ) Notice: Subject to any disclaimer, the term of this patent is extended or adjusted under 35 U.S.C. 154(b) by 0 days.

(21) Appl. No.: 13/113,283

(22) Filed: May 23, 2011

(65) Prior Publication Data

US 2011/0222297 A1 Sep. 15, 2011

Related U.S. Application Data

(63) Continuation of application No. 12/056,906, filed on Mar. 27, 2008, now Pat. No. 7,945,995.

(51) Int. Cl.
*F21V 15/01* (2006.01)
*H05K 5/00* (2006.01)

(52) U.S. Cl.
USPC ............ 362/221; 362/362; 220/810; 220/811

(58) Field of Classification Search
USPC .......................... 362/221, 362; 220/810, 811
See application file for complete search history.

(56) References Cited

U.S. PATENT DOCUMENTS

| | | | | |
|---|---|---|---|---|
| 343,340 | A | 6/1886 | Remus | |
| 494,988 | A | 4/1893 | Libbey | |
| 849,502 | A | 4/1907 | Rude | |
| 1,165,908 | A | 12/1915 | Rietveld | |
| 1,389,728 | A | 9/1921 | Akimoff | |
| 1,891,740 | A | 12/1932 | Westerman | |
| 2,483,304 | A | 9/1949 | Vogel | |
| 3,082,903 | A | 3/1963 | Stevens et al. | |
| 3,561,039 | A | 2/1971 | Amrein | |
| 4,234,080 | A | 11/1980 | Gellert | |
| 4,878,266 | A | 11/1989 | Cubides | |
| 5,057,979 | A | 10/1991 | Carson et al. | |
| 5,425,212 | A | 6/1995 | Menchettti | |
| 5,503,138 | A | 4/1996 | Chang | |
| 5,860,550 | A | 1/1999 | Miller et al. | |
| 5,879,070 | A | 3/1999 | Severloh | |
| 6,175,989 | B1 | 1/2001 | Carpenter et al. | |
| 6,205,713 | B1 | 3/2001 | Thompson et al. | |
| 6,216,316 | B1 | 4/2001 | Errichiello | |
| 6,230,428 | B1 | 5/2001 | Albin | |
| 6,294,859 | B1 | 9/2001 | Jaenker | |
| 6,334,235 | B2 | 1/2002 | Duperray et al. | |
| 6,415,944 | B1 | 7/2002 | Toussant | |
| 6,820,952 | B2 | 11/2004 | Austin et al. | |
| 6,889,411 | B2 | 5/2005 | Hinkley et al. | |
| 7,080,923 | B2 * | 7/2006 | Plunk et al. | 362/225 |
| 7,191,631 | B2 | 3/2007 | Break | |
| 7,234,843 | B2 | 6/2007 | Regester et al. | |
| 7,685,676 | B2 | 3/2010 | McClellan | |
| 2007/0216856 | A1 | 9/2007 | Grove | |

* cited by examiner

*Primary Examiner* — Anabel Ton

(57) ABSTRACT

A one-piece hinge mechanism includes a first member having a plurality of fingers, the fingers extending toward a second member, the second member having a plurality of fingers extending toward the first member, the fingers of the first member and the fingers of the second member engaging opposite sides of a web extending between the first member and the second member, the web being torsionally loaded when one of the first member is pivoted relative to the second member.

22 Claims, 9 Drawing Sheets

METAL LIVING HINGE

CROSS REFERENCES TO RELATED APPLICATIONS

This application is a continuation patent application of and claims priority to and benefit from currently pending U.S. patent application Ser. No. 12/056,906, filed Mar. 27, 2008, which is incorporated herein, in its entirety, by reference.

STATEMENT REGARDING FEDERALLY SPONSORED RESEARCH OR DEVELOPMENT

None.

REFERENCE TO SEQUENTIAL LISTING, ETC

None.

BACKGROUND

1. Field of the Invention

The present invention relates generally to a metal living hinge mechanism. More particularly, the invention relates to a metal living hinge formed of sheet metal and which may be used through a preselected angular range for some minimum number of cycles without failure due to bending stress.

2. Description of the Related Art

Various devices utilize sheet metal components. Many of these components require repeatable access by opening, and therefore utilize a hinge. However, multi-piece hinge mechanisms are costly, and more difficult to incorporate in the manufacturing process. In the lighting industry, there is a multitude of fixture types, including for instance, troffer lighting, recessed lighting, outdoor landscaping, and in-cove lighting. In the various lighting fixtures, it is desirable to utilize a junction box or ballast housing which has a pivoting door assembly. These structures generally require limited access to internal components during installation and for occasional maintenance issues.

With respect to in-cove luminaires, these fixtures have a certain unique problem as related to height and serviceability of the devices. Architects generally utilize the smallest cove allowable to conceal the fixture, which imposes limitations on the height and depth of the fixture. This generally limits the ability to install reflectors and larger ballasts.

Maintenance issues are also a design factor which must be accommodated. Lamp replacement in-cove lighting may be at heights of twenty or more feet above ground level. Ballasts must also be accessible, as they typically need replacement after several years of continuous use. During the typical life of a fixture, ballasts may need to be replaced five to seven times. Since many of these fixtures are formed of stamped metal, doors must be removably formed. A hinge detail would be preferable to provide access to the ballast area of the fixture without necessitating removal of a door. For example, a living hinge assembly would be desirable, however such living hinge must be able to withstand a certain minimum number of cycles in order to allow for lamp changes and/or ballast replacements. Heretofore, such living hinge has not been available.

Given the foregoing, it will be appreciated that a metal living hinge assembly is needed which may be formed of sheet metal and allows repeated use through a preselected angular range of motion and number of cycles before failure.

The living hinge of the instant disclosure may be utilized with various types of devices, including but not limited to luminaires.

SUMMARY OF THE INVENTION

A one-piece hinge mechanism comprising a first member having a plurality of fingers, the fingers extending toward a second member, the second member having a plurality of fingers extending toward the first member, the fingers of the first member and the fingers of the second member engaging opposite sides of a web extending between the first member and the second member, the web being torsionally loaded when one of the first member is pivoted relative to the second member.

A living hinge mechanism for use with a light fixture, comprising a first fixture member having a first axis, a second fixture member having a second axis generally aligned with the first axis, a living hinge defined by a plurality of fingers extending from the first fixture member and a second plurality of fingers extending from the second fixture member, an arm extending between the first fixture member and the second fixture member, the first plurality of fingers and the second plurality of fingers extending to the arm. The living hinge is formed of metal. The metal being between 10 gauge and 26 gauge cold rolled steel. The living hinge more preferably being between about 20 and 24 gauge cold rolled steel. The living hinge arm having an axis which is parallel to the first axis and the second axis. The first fingers being offset from the second fingers in a direction perpendicular to the first and second axes. The living hinge having a limited life cycle. The life cycle being at least about 80 cycles through an arc of about 120 degrees. The life cycle being about 200 cycles through an arc of about 90 degrees. The first and second plurality of fingers being aligned on opposite sides of the arm. The living hinge wherein the living hinge is utilized with an in-cove light.

A hinge assembly for a luminaire comprising an arm extending in a direction substantially parallel to a first assembly portion edge and a second assembly portion edge, at least one first finger extending from the first assembly portion edge to the arm, at least one second finger extending from the second assembly portion edge to the arm, wherein the at least one first finger and the at least one second finger are offset in a direction which is transverse to the arm. The hinge assembly wherein one of the at least one first finger and the at least one second finger are disposed at an end of the arm. The hinge assembly wherein two fingers of the at least one first finger and the at least one second finger are located at opposed ends of the arm. The hinge assembly defining a portion of a luminaire fixture. The hinge assembly defining a portion of a ballast housing. The hinge assembly comprising apertures disposed between the fingers. The fingers having curved sidewalls and the apertures being oblong in shape. Alternatively, the fingers having straight sidewalls and the apertures being rectangular in shape.

BRIEF DESCRIPTION OF THE DRAWINGS

The above-mentioned and other features and advantages of this invention, and the manner of attaining them, will become more apparent and the invention will be better understood by reference to the following description of embodiments of the invention taken in conjunction with the accompanying drawings, wherein.

DETAILED DESCRIPTION

Figure 1:
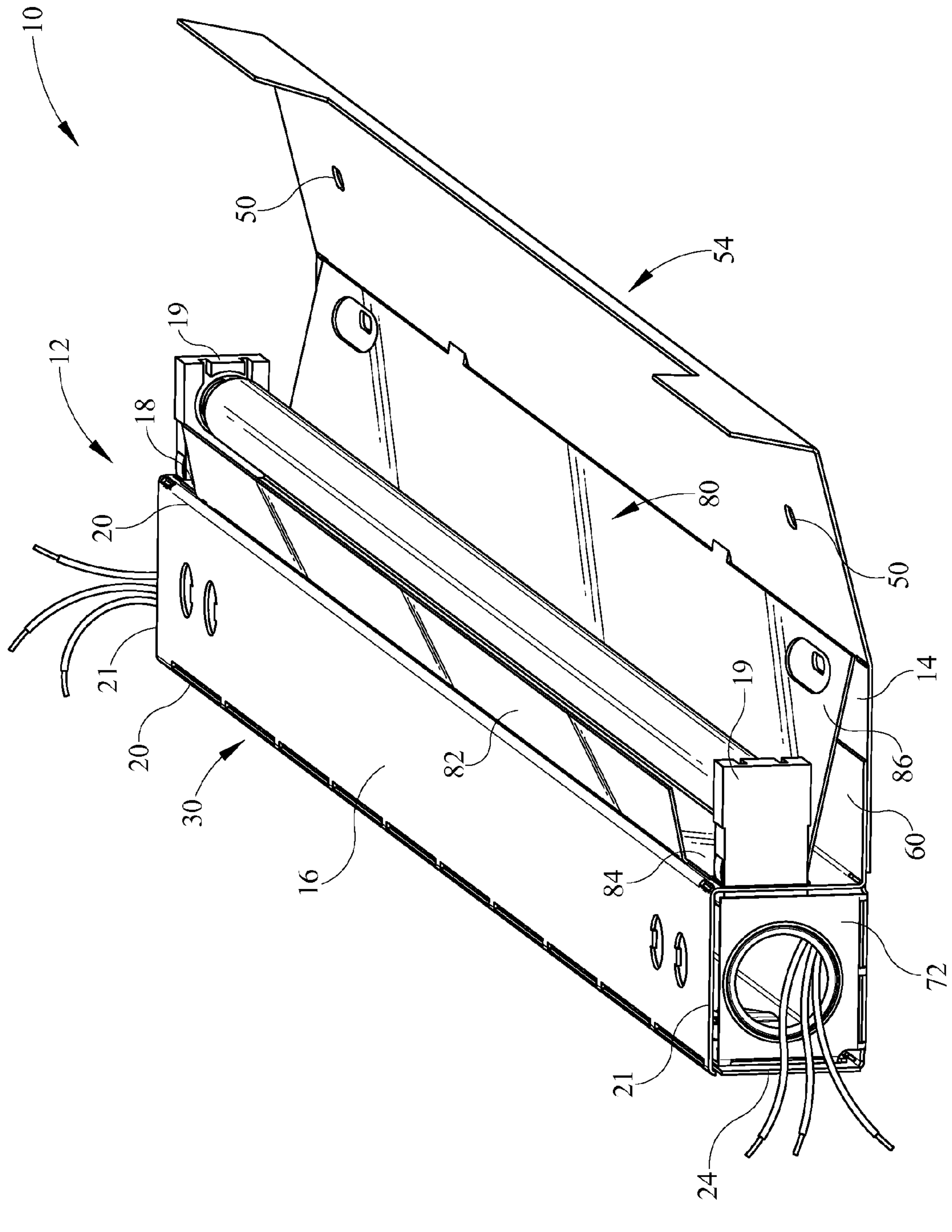
FIG. 1 depicts a perspective view of an exemplary in-cove luminaire fixture.

It is to be understood that the invention is not limited in its application to the details of construction and the arrangement of components set forth in the following description or illustrated in the drawings. The invention is capable of other embodiments and of being practiced or of being carried out in various ways. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items. Unless limited otherwise, the terms "connected," "coupled," and "mounted," and variations thereof herein are used broadly and encompass direct and indirect connections, couplings, and mountings. In addition, the terms "connected" and "coupled" and variations thereof are not restricted to physical or mechanical connections or couplings.

Referring now in detail to the drawings, wherein like numerals indicate like elements throughout the several views, there are shown in FIGS. 1-9 various aspects of a metal living hinge. Specifically, a luminaire fixture utilizes a metal living hinge design which is operable through a preselected angular range and at least a preselected life cycle. In the embodiment described, although the hinge depicted is in use with a luminaire fixture and a junction box, such depiction and related description is merely exemplary and therefore should not be considered limiting. The hinge may be utilized with any type of structure, and is particularly useful with sheet metal components.

Referring now to FIG. 1, an in-cove fixture 10 is depicted in perspective view. Although the fixture 10 described herein is an in-cove fixture, the description is merely exemplary as the metal living hinge may be utilized with various types of products utilizing sheet metal housings requiring limited open-ability and close-ability including, but not limited to, HVAC duct or automotive components. Additionally, the use described herein for an in-cove light should not be considered limiting with respect to use of the hinge with luminaires as multiple fixture styles may incorporate the hinge as well as luminaire components such as, for example, junction boxes or other enclosures and therefore the teachings should not be considered limited to ballast housings. The fixture 10 comprises a ballast housing 12 and a fixture arm or frame member 14 having reflectors 54 positioned at an end of the frame member 14 opposite the ballast housing 12. The hinge 30 described herein is utilized in the ballast housing to provide internal access thereto for changing of the ballast components. Such use requires limited access by movement of a ballast wall through a preselected arcuate distance during the life of the fixture without premature failure of the metal hinge.

The fixture 10 and specifically the hinge 30 may be formed of 18-26 gauge cold rolled steel, although other materials may be utilized. More preferably, the hinge 30 may be formed of 20-24 gauge cold rolled commercial grade steel. The fixture 10 may be painted, anodized or otherwise have a white finish, however alternative colors may be utilized and therefore should not considered limiting. The fixture 10 may come in various lengths. For example, the distance measured along the direction that the hinge 30 extends may be two feet, three feet or four feet, however alternative lengths may be utilized. Likewise, alternative devices, other than luminaires, may be utilized with the metal living hinge of the present invention.

The ballast housing 12 comprises four sides including a first fixture member 16, a second fixture member 24, a fixture frame or fixture arm 14 and a socket mounting member 18. The first fixture member 16 is generally rectangular in shape having a pair of parallel long edges 20 and a pair of parallel short edges 21, which are substantially perpendicular to the long edges 20. The fixture members 16, 24 are shown defining a portion of a ballast housing, however, the fixture members may define alternative luminaire structures, including, for example, a junction box housing, a fixture frame, and may also be used on various types of luminaires, therefore not specifically limited to in-cove lighting.

The first fixture member 16 is integrally connected with a socket mounting member 18. The socket mounting member 18 has a substantially rectangular shape like the first fixture member 16 and is connected along one of the long edges 20. Additionally, the first fixture member 16 is disposed at an angle of about 90 degrees to the socket mounting member 18, which depends from the first fixture member 16 toward the frame member 14.

Extending along one of the edges 20 of the first fixture member 16, opposite the socket mounting member 18, is a living hinge 30. The living hinge 30 connects the first fixture member 16 and a second fixture member 24 and provides opening and closing access to the ballast housing 12 through the first fixture member 16. Although the term fixture is used, the term should not be considered limiting since the term fixture is only used because the exemplary device having the living hinge is a light fixture or luminaire. As previously indicated, the hinge element may be utilized with various types of devices and should not be construed as being limited to luminaires. The members 16,24 could be any type of members based on the type of device the hinge is utilized with. The living hinge 30 is designed to have a limited life cycle of at least 80 cycles through an arcuate distance of 120 degrees. Additionally, the living hinge 30 may move through a path of about 90 degrees for 200 cycles without failure. However, the living hinge 30 has a limited life cycle because of its eventual failure due to the hinge 30 being formed of sheet steel, which is desirable for costs but has a lower ductility than other materials.

Along a long edge of the second fixture member 24, opposite the first fixture member 16, is the fixture frame 14, which connects to the second fixture member 24 and is disposed at an angle of about 90 degrees to the second fixture member 24. The frame member 14 defines a lower surface of the ballast housing 12 and the fixture 10 and is generally parallel to the first fixture member 16. The fixture frame 14 extends outwardly beyond the ballast housing 12 and bends upwardly for optically desirable characteristics. At an end of the fixture arm or member 14, opposite the ballast housing 12, a linear reflector 54 is positioned along the edge of the device 14 and bends upwardly, also for optically desirable characteristics. The frame member 14 comprises a plurality of fastening apertures 50 for mounting of the fixture 10 within a cove. The apertures

50 allow the fixture 10 to be fastened along the surface of the frame member 14 aligned with the lower surface of the ballast housing 12 or at an angled surface of the frame member 14. The reflector 54 is located at an end of the frame member 14 and is angled upwardly in the orientation depicted in FIG. 1. The reflector 54 aids with directing light from the cove area where the fixture 10 is located, so as to preclude shadows in the cove area where the fixture 10 is positioned.

The socket mounting member 18 includes opposed lamp sockets 19 which receive a lamp 17. The sockets 19 are merely exemplary as various types of lamps may be utilized and therefore should not be considered limiting. For example, the sockets 19 may be sized to receive T5 or T8 lamps, although other sizes may also be used.

Above the frame member 14, a reflector 80 is disposed which has a plurality of reflector surfaces. The reflector 80 includes a first surface 82 above the lamp, a second surface 84 behind the lamp and adjacent the socket mounting member 18. At least one additional reflective surface 86 extends from the second surface 84 to the fixture. The reflector 80 of the exemplary device is a specular material having a mirrored finish. However, alternative finishes may be utilized, such as a diffuse finish or other.

Extending from the socket mounting member 18 is a flange 60 which is substantially rectangular in shape. The flange 60 extends from the socket mounting member 18 at an angle of about 90 degrees, and is positioned against the upper surface of the frame member 14. The flange 60 includes bosses 62, which receive complementary bosses 64 disposed on the frame member 14, so as to properly align the flange 60 on the frame member 14 as well as properly position the first fixture member 16 and socket member mounting 18 on the fixture 10.

Figure 2:
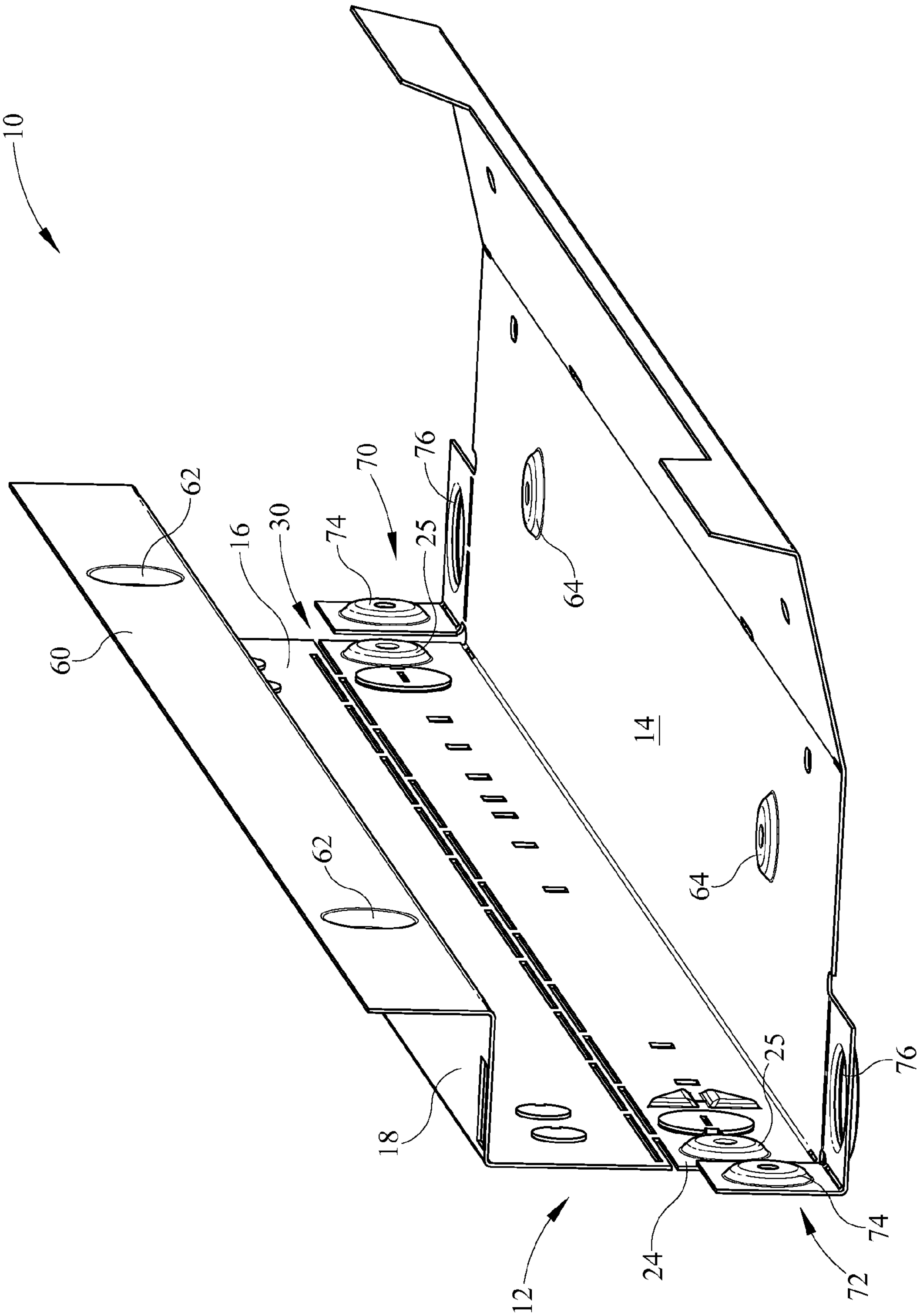
FIG. 2 depicts an end view of in-cove luminaire of FIG. 1.

Referring now to FIG. 2, the fixture 10 is depicted in an unfolded position, wherein the ballast housing 12 is not fully formed. As depicted, the living hinge 30 is not folded so that the second fixture member 24 and the first fixture member 16 are aligned, rather than disposed at 90 degrees to one another. Disposed on the frame 14, are first and second bosses 64 which are aligned with bosses 62 of flange 60 during manufacture and formation of the ballast housing 12. With the bosses 62 and 64 aligned, the folded portion of the ballast housing 12 may be fastened down, so as to form the rectangular volume depicted in FIG. 1.

Also shown in FIG. 2 are first and second L-brackets 70, 72. The brackets 70,72 are folded from the position shown in FIG. 2 along the edge frame member 14. Once folded along the edge of frame 14, the L-brackets 70, 72 are positioned upright, so as to form first and second end walls of the ballast housing 12.

Figure 3:
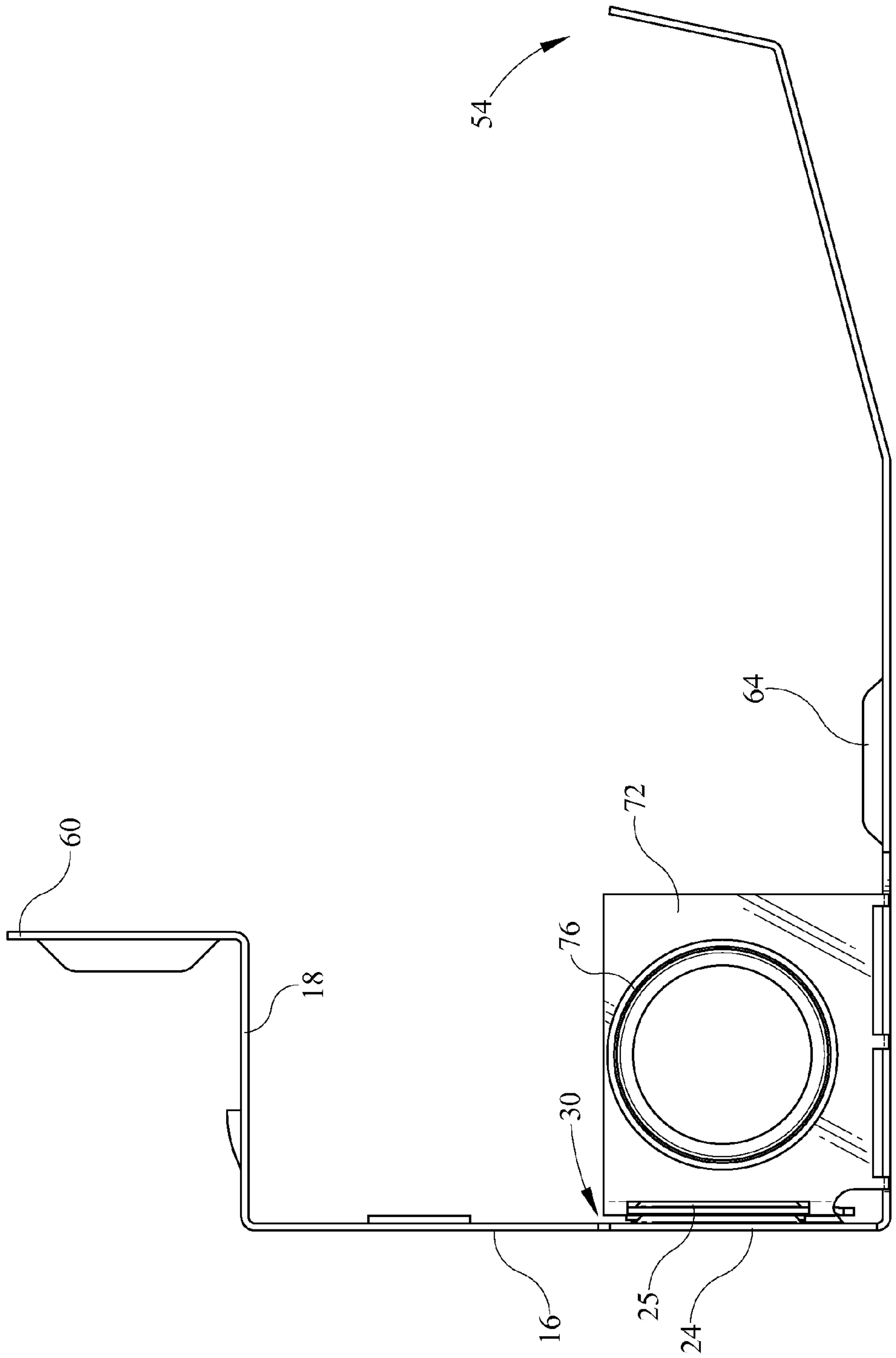
FIG. 3 depicts a perspective view of the in-cove luminaire of FIG. 1 with the ballast housing shown in an open position.

Referring now to FIGS. 2 and 3, the bracket 72 is move from a first position where it is not operational to a folded, operational position. In FIG. 2, the bracket 72 is shown to include a boss 74. When the bracket is folded along the edge adjacent frame member 14, the boss 74 moves toward a complimentary boss 25 and receives the boss 25. The brackets 70,72 also include an aperture 76 which may be utilized as an access to the internal area of the ballast housing 12 for conduit, muck like a knock-out which will be understood by one skilled in the art.

Figure 4:
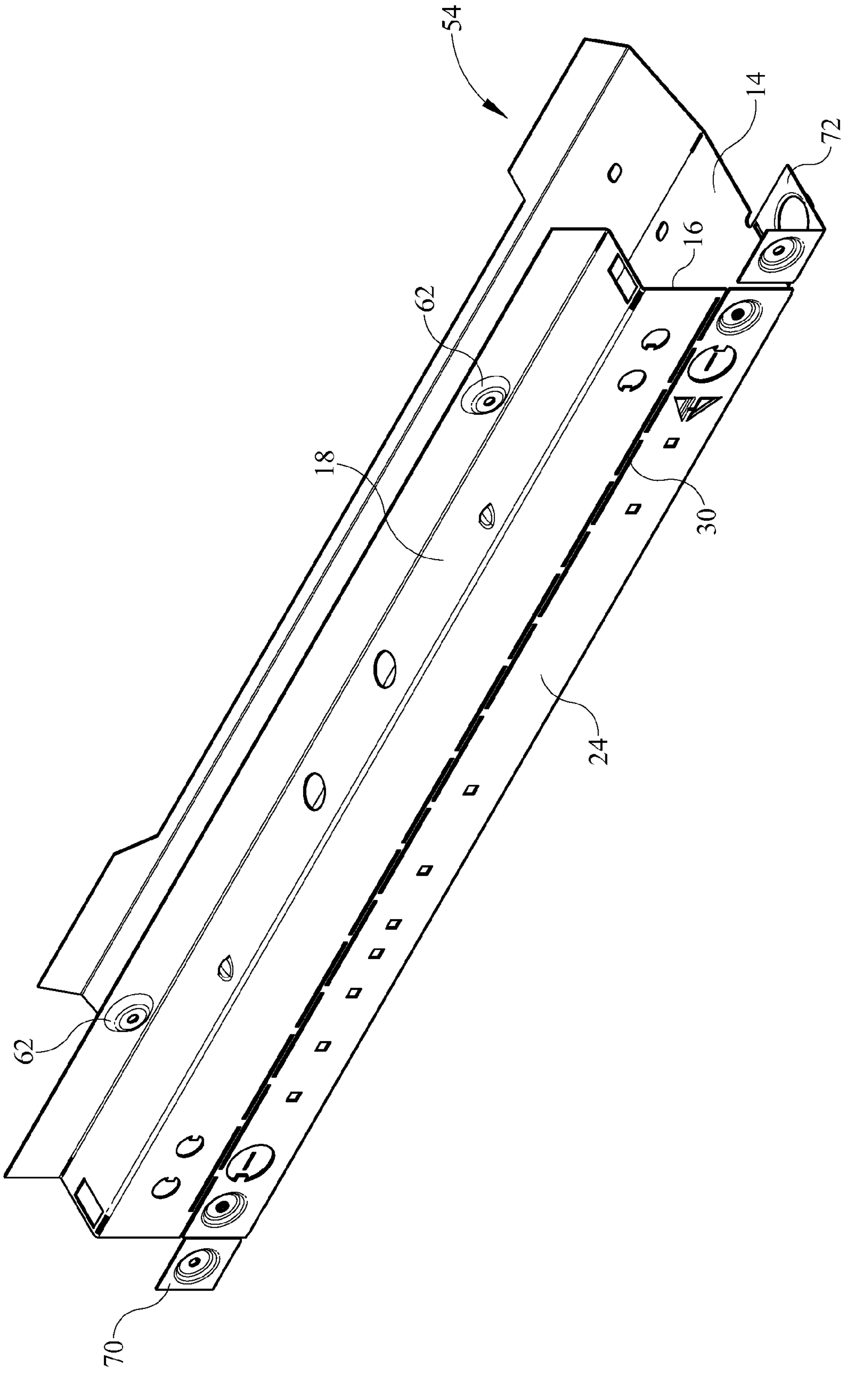
FIG. 4 depicts a perspective view of the in-cove luminaire of FIG. 3 in an opposite position.

Referring now to FIG. 4, the unformed fixture 10 with the yet to be folded hinge 30 is depicted in other perspective view. The outer surface of the second fixture member 24 is depicted. The member 24 includes a plurality of fastening apertures to fasten the fixture 10 in the cove area. Once the second member 24 is fastened in the cove area, the first fixture member 16 may be folded or unfolded along hinge 30 to obtain access to the interior of ballast housing 12.

Figure 5:
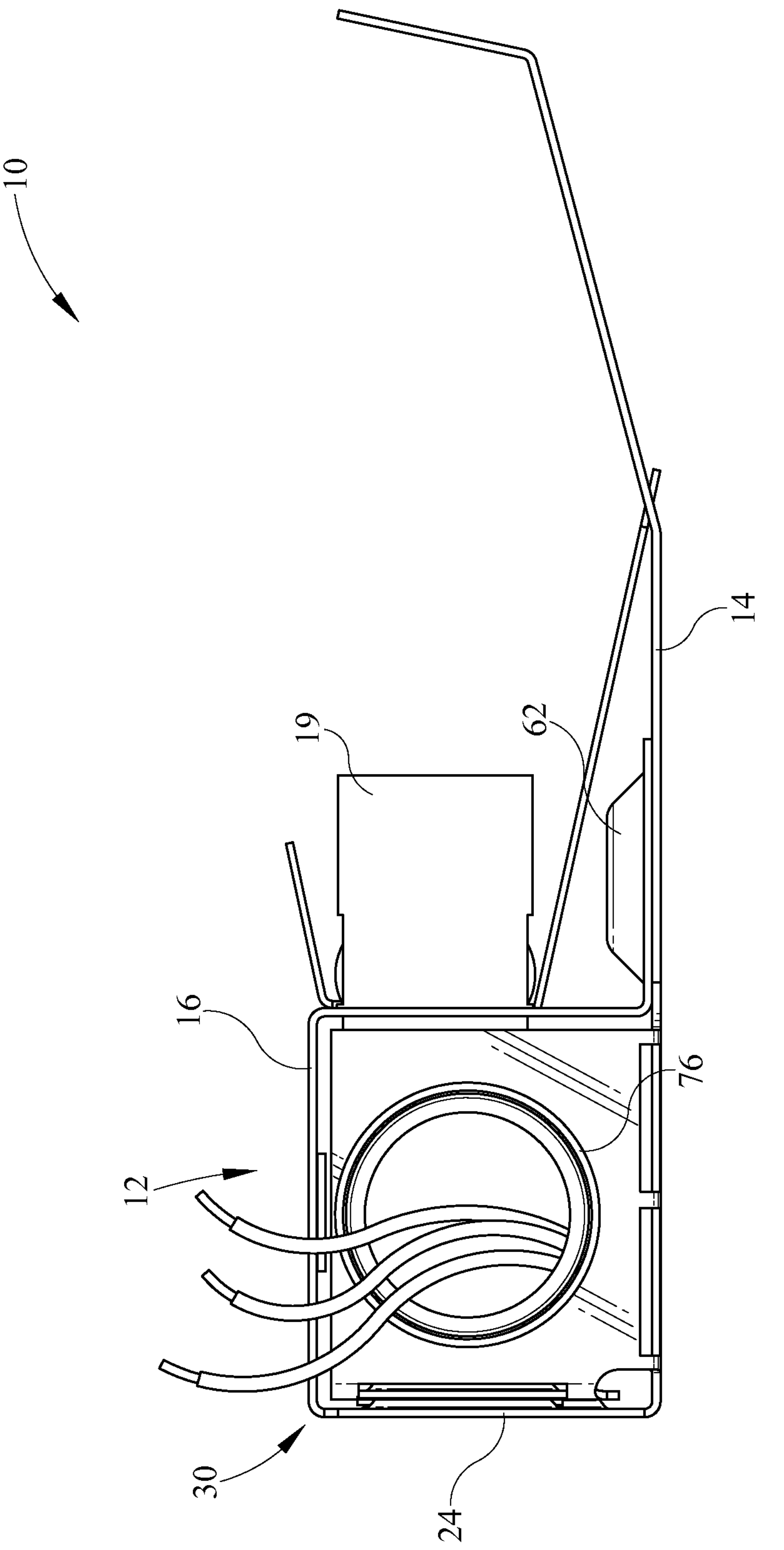
FIG. 5 depicts an end view of in-cove luminaire in an open position.

Referring now to FIG. 5, the fixture 10 is shown in an end view. The ballast housing 12 is shown with the hinge 30 folded, so that the housing 12 is formed on the fixture 10. With the ballast housing 12 formed in the position depicted, lamp sockets are positioned to receive a lamp therein. The lamp sockets 19 are in electronic communication with an electronic ballast which is positioned within the housing 12, but is not shown.

Figure 6:
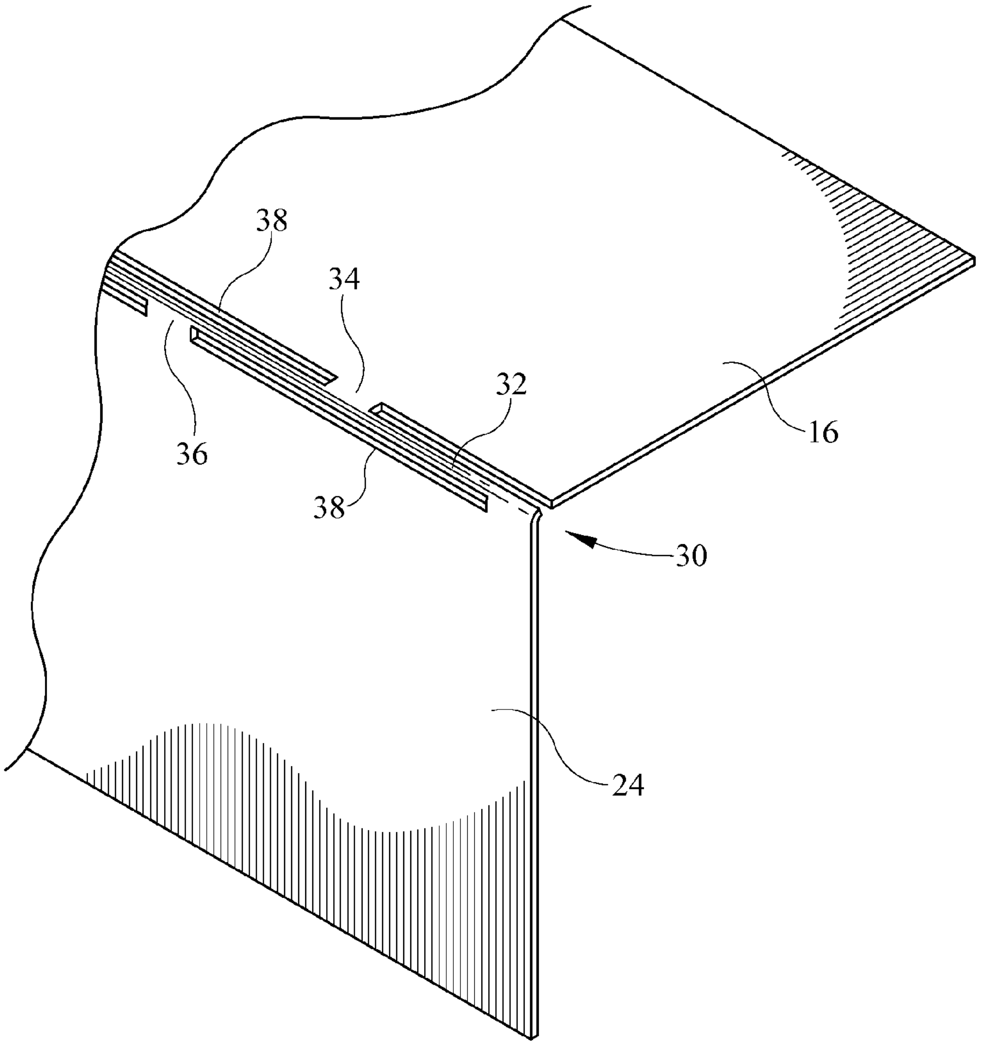
FIG. 6 depicts a perspective view of a first hinge detail.
Figure 7:
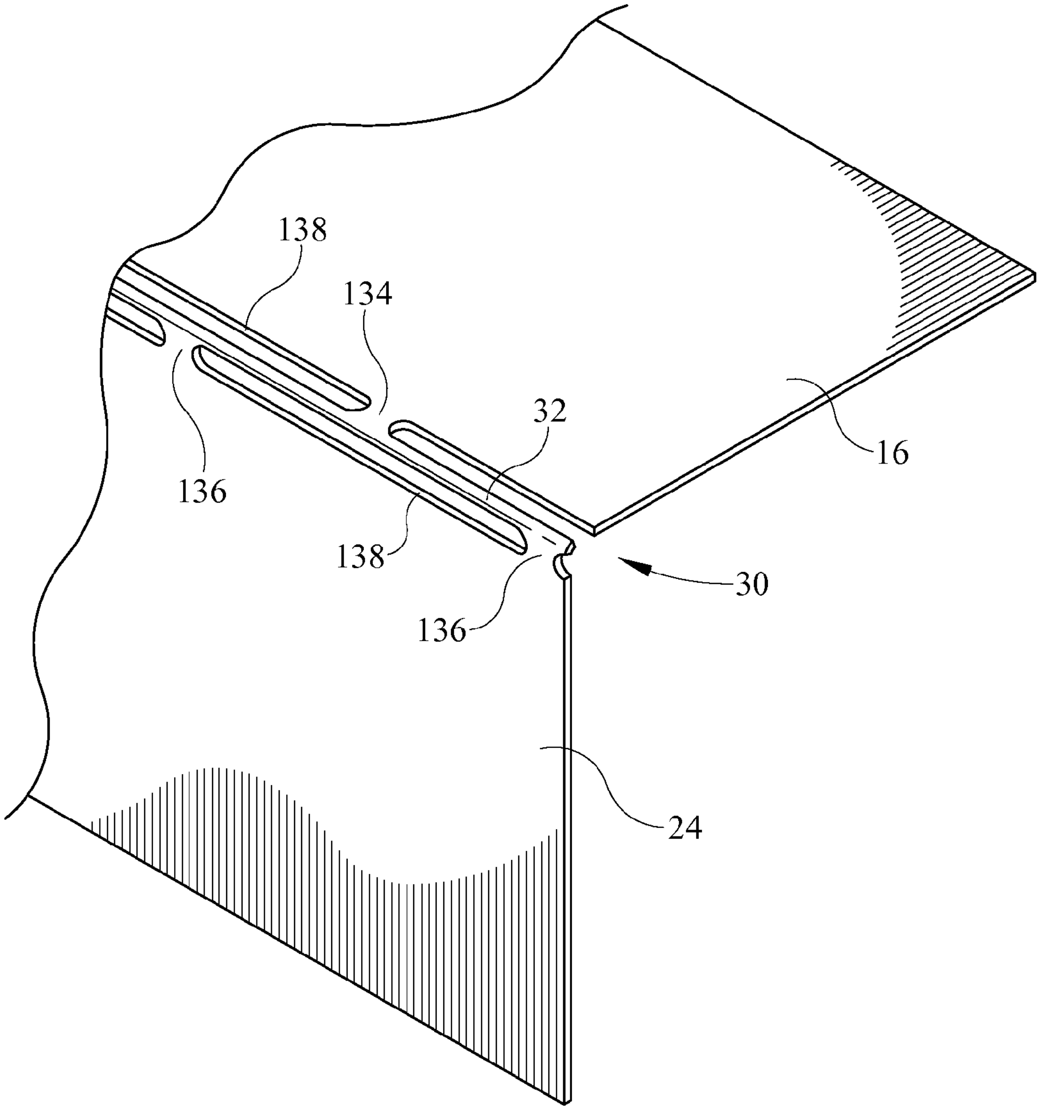
FIG. 7 depicts a perspective view of a second hinge detail.
Figure 8:
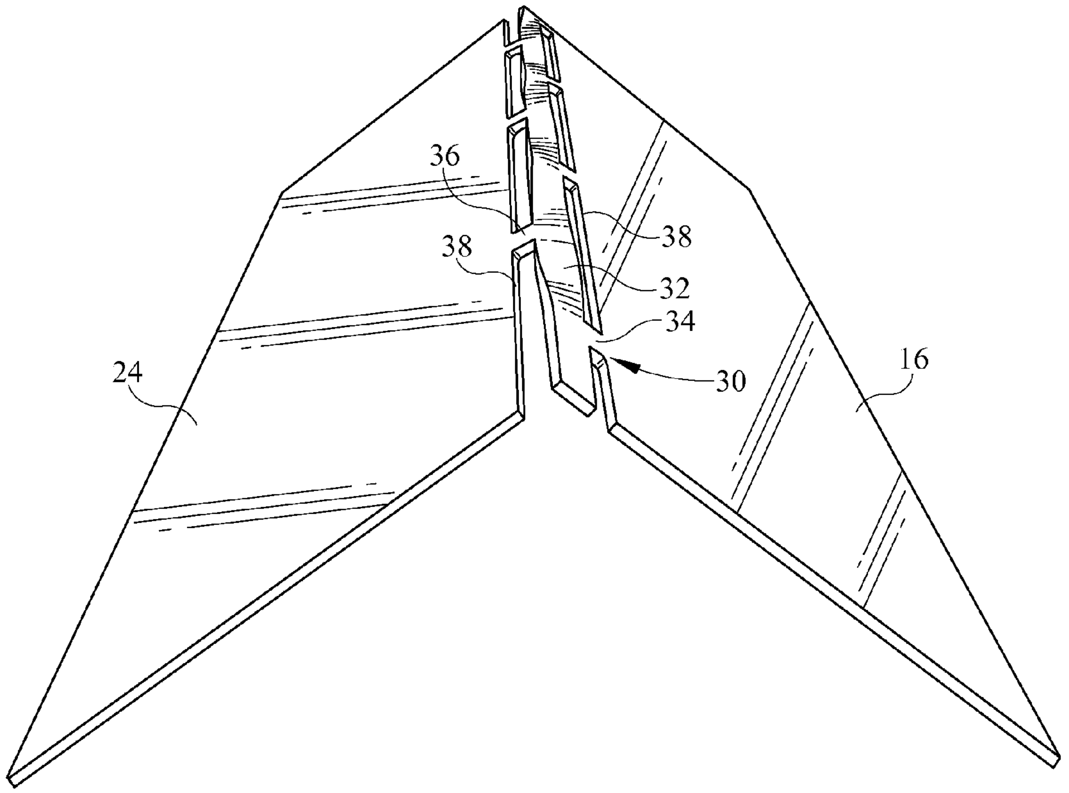
FIG. 8 depicts a perspective view of a hinge detail in a folded position with the torsional loading of the hinge; and, FIG. 9 depicts a perspective view of a junction box which incorporates the metal living hinge design.
Figure 9:
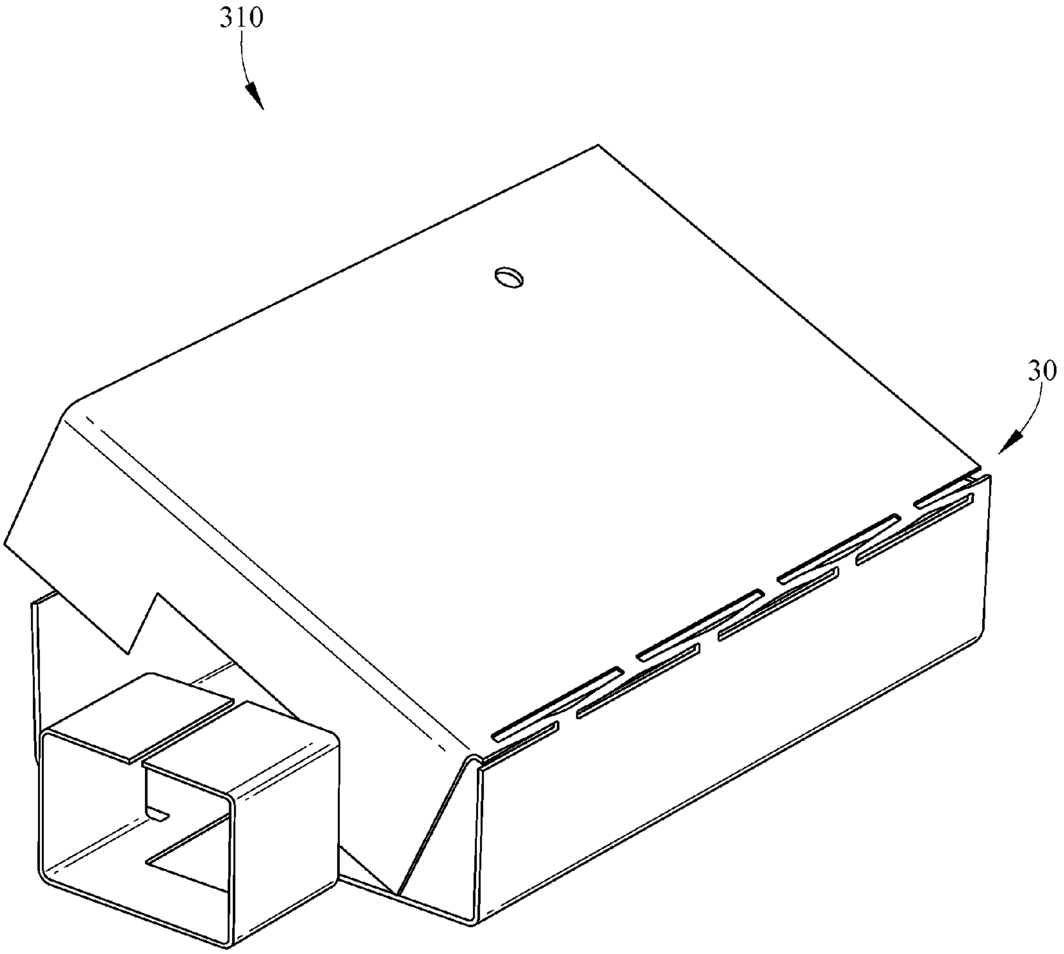

Referring now to FIG. 6, a detail perspective view of the hinge 30 is depicted connecting the first fixture member 16 to the second fixture member 24. The hinge 30 is defined by an arm 32 extending parallel to edges of the first fixture member 16 and second fixture member 24. The arm 32 is a thinned web of metal extending between the first fixture member 16 and the second fixture member 24. A plurality of fingers 34 extend from the first fixture member 16 to the arm 32. Likewise, a plurality of fingers 36 extend from the second fixture 24 to the arm 32. The arm 32 is divided into a plurality of lengths wherein each length is defined between a finger 34 and an opposed offset finger 36. As the arm lengths increase, the torsional stress in the arm is decreased during operation. The fingers 34, arm 32 and edges of the first and second fixture member 16, 24 define a plurality of apertures 38 on opposite sides of the longitudinal axis of arm 32. The sides or edges of the fingers 34, 36 define the end shapes of the apertures 38. For example, as depicted in FIG. 6, the fingers 34, 36 have sidewalls which are straight and therefore define rectangular shaped apertures 38. Alternatively, and with reference to FIG. 7, the sidewalls of the fingers 134 of the alternative embodiment are defined by curvilinear ends. The curved ends reduces stress in the corners of the apertures which may provide a longer life for the hinge 30, however, the squared end shape is more practical for manufacturing purposes. The apertures 38, 138 however may have various shapes such as a plurality of triangles, trapezoids, triangles or other shapes and therefore the shapes depicted should not be considered limiting. Similarly, the fingers 34,36 and 134,136 are depicted as generally rectangular in shape but such shape should not be considered limiting as various shapes may be utilized. In either embodiment, the fingers of one of the first fixture member 16 or second fixture member 24 extend from the fixture members 16,24 and connect to ends of the arm 32. This connection at the end of the arm 32 stabilizes the arm 32 and the hinge 30. Thus, the hinge 30 will pivot torsionally about the longitudinal axis of the arm 32, and along the surface of the arm 32, as shown in FIG. 8. Further, the fingers 34, 36 or 134, 136 are offset along the length of the arm 32. As shown in FIGS. 6 and 7, the fingers 34,36 are not aligned in a direction transverse to arm 32. Instead, the fingers 34, 36 are offset by about one-half the length of an aperture 38 in a direction parallel to the arm 32. Likewise, in FIG. 7, the fingers 134 are offset from the fingers 136 about one-half the length of an aperture 138. The apertures 38, 138 are formed by punching the metal hinge 30. Thus, the hinge 30 may be formed of a single piece of material rather than multiple pieces during a manufacturing process. Because prior art hinges are typically loaded with bending stress, such hinge could not be formed of metal and still have a useful number of life cycles. To the contrary, the present hinge 30 is loaded torsionally which allows the hinge 30 to be formed of metal and have a desirable number of life cycles before failure.

Referring now to FIG. 8, the hinge is shown in perspective view with the first member 16 and the second member 24 folded relative to one another. In operation, the hinge 30 operates by torsionally twisting along the axis of the arm 32 rather than applying a bending stress to the metal. Repeated bending stress on the metal piece will result in breakage sooner than desired. However, the torsional loading of the arm 32 does not deteriorate the metal as rapidly as bending stress which allows for longer life cycles of the hinge 30. This is in part due to the fact that the torsional load does not cause bending of the metal through a large angular distance the way a single piece of metal connecting one member to an opposed member would. Such bending stress or bending moment of a prior art hinge will require a greater degree of flexing of the metal as opposed to the torsional load placed on the present invention. Thus, the hinge 30 of the present design will have more cycles during its life without breaking than a prior art one piece hinge wherein the metal is under repeated bending stress through larger angular distances.

With the members 16, 24 in a folded position moving from about 180 degrees apart toward about 90 degrees apart, the fingers 34, 38 are rigid enough to cause torsional flexing of the arm 32 about an axis parallel to the longitudinal axis of the arm 32. The flexing of the arm 32 in opposed directions is dictated by the opposed offset fingers 34,36. As shown in the Figure, the arm 32 has wave like bends toward each finger 34,36. The angular bends of the arm 32 are less than the range of motion of the first and second fixture members 16,24. For example, the arm 32 may rotate by an angle of about 45 degrees in one direction and by an angle of about 45 degrees in an opposite direction when one member 16 moves through a total distance of 90 degrees relative to the other member 24. Prior art hinges would require bending of a section of metal hinge between the members of 90 degrees, resulting in premature failure of the hinge 30. The present design provides for increased use and life of the hinge 30, as opposed to a hinge element which extends from the first fixture member 16 to the second fixture member 24 and must bend through a large angular distance, such as the 90 degrees mentioned above. The hinge 30 has reduced stress due to the decreased amount of bending of the metal in the arm 32. Other factors which may affect the number of life cycles include the width of the arm 32 and the metal thickness previously described. Further, the plurality of lengths of the arm 32 from one finger 34 to a second finger 36 will also affect the torsional stress. Longer lengths generally decrease the torsional stress. The thickness of the metal in the arm will also dictate an increase or decrease in torsional loading Referring now to FIG. 9, a junction box 310 is depicted which utilizes the hinge 30 of the present design. The junction box 310 may be formed by folding adjacent panels of a preformed plate to define the box while still providing interior access by opening. However, as previously mentioned, although the hinge 30 is shown in use with various components of a luminaire, such use should not be considered limiting as the hinge 30 design may be utilized with various devices having sheet metal and requiring limited accessibility for a preselected number of life cycles and through a preselected angular distance. Use of hinge 30 allows the junction box 310 to be formed of a single piece of metal, rather than requiring separate pieces for the door and hinge element.

The foregoing description of several methods and an embodiment of the invention has been presented for purposes of illustration. It is not intended to be exhaustive or to limit the invention to the precise steps and/or forms disclosed, and obviously many modifications and variations are possible in light of the above teaching. It is intended that the scope of the invention be defined by the claims appended hereto.

What is claimed is:

1. A ballast housing, comprising:

an arm on said ballast housing free of interruptions in a longitudinal direction between a first end and a second end thereof and in a lateral direction transverse to said longitudinal direction, said arm extending in a direction substantially parallel to a first ballast housing edge and a second ballast housing edge of said ballast housing;

at least one first finger extending from said first ballast housing edge to said arm;

at least one second finger extending from said second ballast housing edge to said arm;

wherein said at least one first finger and said at least one second finger are offset in said lateral direction and wherein said arm is torsionally loaded during pivoting motion of said first and second ballast housing edges so that torsional bending occurs along an axis of said arm extending in said longitudinal direction.

2. The ballast housing of claim 1, wherein one of said at least one first finger and said at least one second finger are disposed at one of said first and second ends.

3. The ballast housing of claim 2, wherein said at least one first finger and said at least one second finger are located at opposed edges of said arm and disposed at about ninety degrees to one another.

4. The ballast housing of claim 1, said ballast housing defines a portion of a luminaire fixture.

5. The ballast housing of claim 1 further comprising apertures disposed between said fingers.

6. The ballast housing of claim 5, said fingers having curved sidewalls and said apertures being oblong in shape.

7. The ballast housing of claim 6, said fingers having straight sidewalls and said apertures being rectangular in shape.

8. The ballast housing of claim 1 wherein lengthening an arm length between said at least one first finger and said at least one second finger decreases torsional loading on said arm.

9. The ballast housing of claim 1 further comprising an aperture between said fingers and wherein lengthening said aperture decreases torsional loading on said arm.

10. A ballast housing, comprising:

a first ballast housing member of said ballast housing having a first axis;

a second ballast member of said ballast housing having a second axis generally aligned with said first axis;

said first ballast housing member and said second ballast member housing disposed substantially perpendicular to one another;

a connection area defined by a plurality of fingers extending from said first ballast housing member and a second plurality of fingers extending from said second ballast housing member;

an arm extending substantially free of interruptions in a first direction parallel to adjacent edges of said first and second ballast housing members and in a second direction transverse to said first direction between two adjacent rows of said fingers, said arm disposed between said first ballast housing member and said second ballast housing member;

said first plurality of fingers and said second plurality of fingers extending to said arm;

wherein a torsional bending axis is defined along said arm.

11. The ballast housing of claim 10, wherein said connection area is formed of metal.

12. The ballast housing of claim 11, said metal being between 10 gauge and 26 gauge cold rolled steel.

13. The ballast housing of claim 12, more preferably being between about 20 and 24 gauge cold rolled steel.

14. The ballast housing of claim 10, said connection area having an axis which is parallel to said first axis and said second axis.

15. The ballast housing of claim 10, said first plurality of fingers being offset from said second plurality of fingers in said second direction.

16. The ballast housing of claim 10, said connection area having a limited life cycle.

17. The ballast housing of claim 16, said life cycle being at least about 80 cycles through an arc of about 120 degrees.

18. The ballast housing of claim 16, said life cycle being about 200 cycles through an arc of about 90 degrees.

19. The ballast housing of claim 10, the first and second plurality of fingers being aligned in said first direction on opposite sides of said arm.

20. The ballast housing of claim 10 wherein said ballast housing is utilized with an in-cove light.

21. A luminaire fixture housing, comprising:

a first fixture member of said luminaire fixture housing having a plurality of fingers, said fingers extending toward a second fixture member of said luminaire housing;

said second fixture member having a plurality of fingers extending toward said first fixture member;

said first fixture member being generally perpendicular to and said second fixture member;

said fingers of said first fixture member and said fingers of said second fixture member engaging opposite sides of an arm, said arm being substantially uninterrupted along its length between a first end and a second end and along its width between said first fixture member and said second fixture member along said arm, said fingers extending between said first and second fixture members and said arm;

said arm being torsionally loaded so that bending occurs along said arm when one of said first fixture member and said second fixture member is pivoted relative to the other of said first fixture member and said second fixture member.

22. A luminaire housing, comprising:

an arm free of interruptions in a longitudinal direction between a first end and a second end thereof and in a lateral direction transverse to said longitudinal direction, said arm extending in a direction substantially parallel to a first ballast housing portion and a second ballast housing portion;

said first and second housing portions being oriented substantially perpendicular to each other;

at least one first finger extending from said first ballast housing edge to said arm;

at least one second finger extending from said second ballast housing edge to said arm;

said first and second housing portions, said arm and said first and second fingers formed integrally of a single rigid, relatively thin material;

wherein said at least one first finger and said at least one second finger are offset in said lateral direction and wherein said arm is torsionally loaded during pivoting motion of said first and second ballast housing edges so that torsional bending occurs along an axis of said arm extending in said longitudinal direction.

* * * * *